(12) United States Patent
Miethaner et al.

(10) Patent No.: US 6,943,393 B2
(45) Date of Patent: Sep. 13, 2005

(54) MEMORY CELL ARRANGEMENT AND METHOD OF FABRICATING IT

(75) Inventors: Stefan Miethaner, Regensburg (DE); Siegfried Schwarzl, Neubiberg (DE); Annette Saenger, Dresden (DE)

(73) Assignee: Infineon Technologies AG, Munich (DE)

( * ) Notice: Subject to any disclaimer, the term of this patent is extended or adjusted under 35 U.S.C. 154(b) by 113 days.

(21) Appl. No.: 10/343,844

(22) PCT Filed: Aug. 28, 2001

(86) PCT No.: PCT/EP01/09901

§ 371 (c)(1),
(2), (4) Date: Jul. 31, 2003

(87) PCT Pub. No.: WO02/19338

PCT Pub. Date: Mar. 7, 2002

(65) Prior Publication Data

US 2004/0004884 A1 Jan. 8, 2004

(30) Foreign Application Priority Data

Sep. 1, 2000 (DE) .......................... 100 43 159

(51) Int. Cl.⁷ ............................................... H01L 29/76
(52) U.S. Cl. ....................................... 257/295; 257/296
(58) Field of Search ................................ 257/295, 296, 257/30, 35, 324, 427, 443; 438/3

(56) References Cited

U.S. PATENT DOCUMENTS

| 5,756,366 A | * 5/1998 | Berg et al. ........................ 438/3 |
| 5,940,319 A | 8/1999 | Durlam et al. |
| 6,153,443 A | * 11/2000 | Durlam et al. ................. 438/3 |

FOREIGN PATENT DOCUMENTS

| DE | 197 44095 | 4/1999 |
| EP | 1 054449 | 11/2000 |
| WO | WO 00/31809 | 6/2000 |
| WO | WO 00/38191 | 6/2000 |
| WO | WO 00/52701 | 9/2000 |

OTHER PUBLICATIONS

Hu, Y.Z. et al., "Chemical–Mechanical Polishing as an Enabling Technology for Giant Magnetoresistance Devices", *Thin Solid Films*, 308–309, pp. 555–561; 1997.

* cited by examiner

*Primary Examiner*—David Nelms
*Assistant Examiner*—Thinh T Nguyen
(74) *Attorney, Agent, or Firm*—Fish & Richardson P.C.

(57) ABSTRACT

Memory cell arrangement having a memory cell array which has at least one layer of magnetoresistive memory components (11) which are each connected to first contact-making lines (10), the first contact-making lines (10) lying within a first dielectric layer (6), and are each connected to second contact-making lines (20; 29; 35), the second contact-making lines (20; 29; 35) lying within a second dielectric layer (17; 27; 32).

8 Claims, 18 Drawing Sheets

PRIOR ART

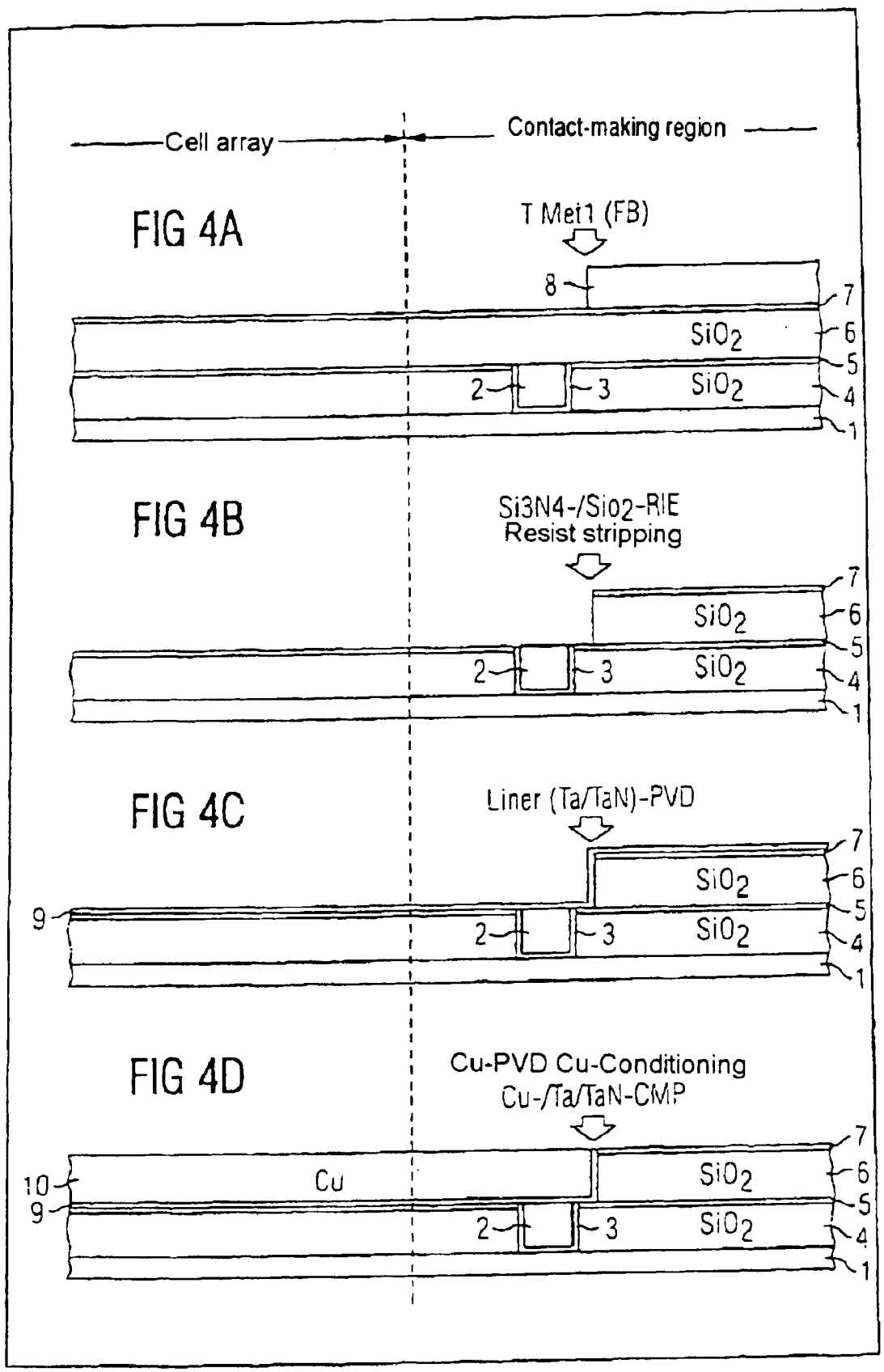

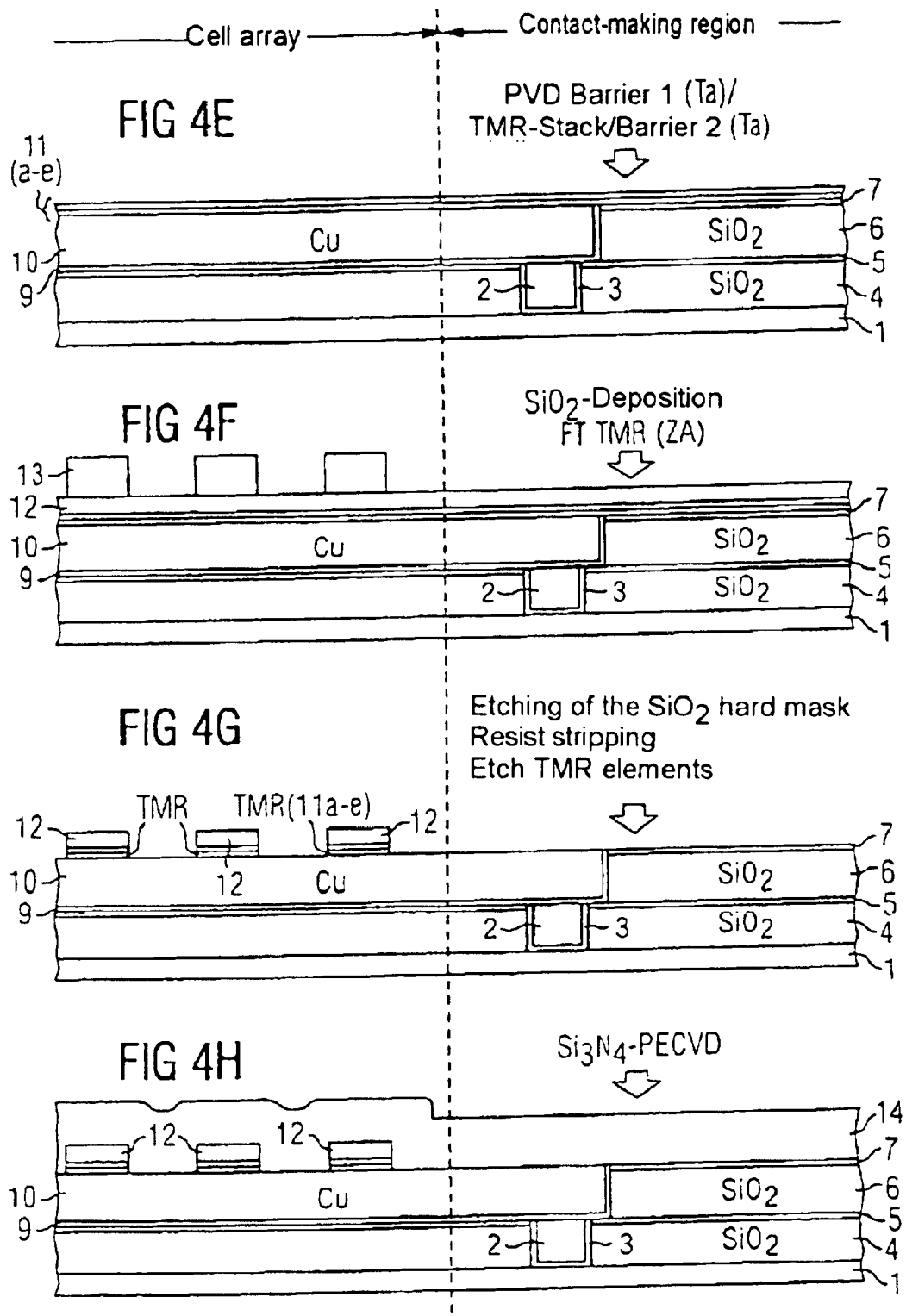

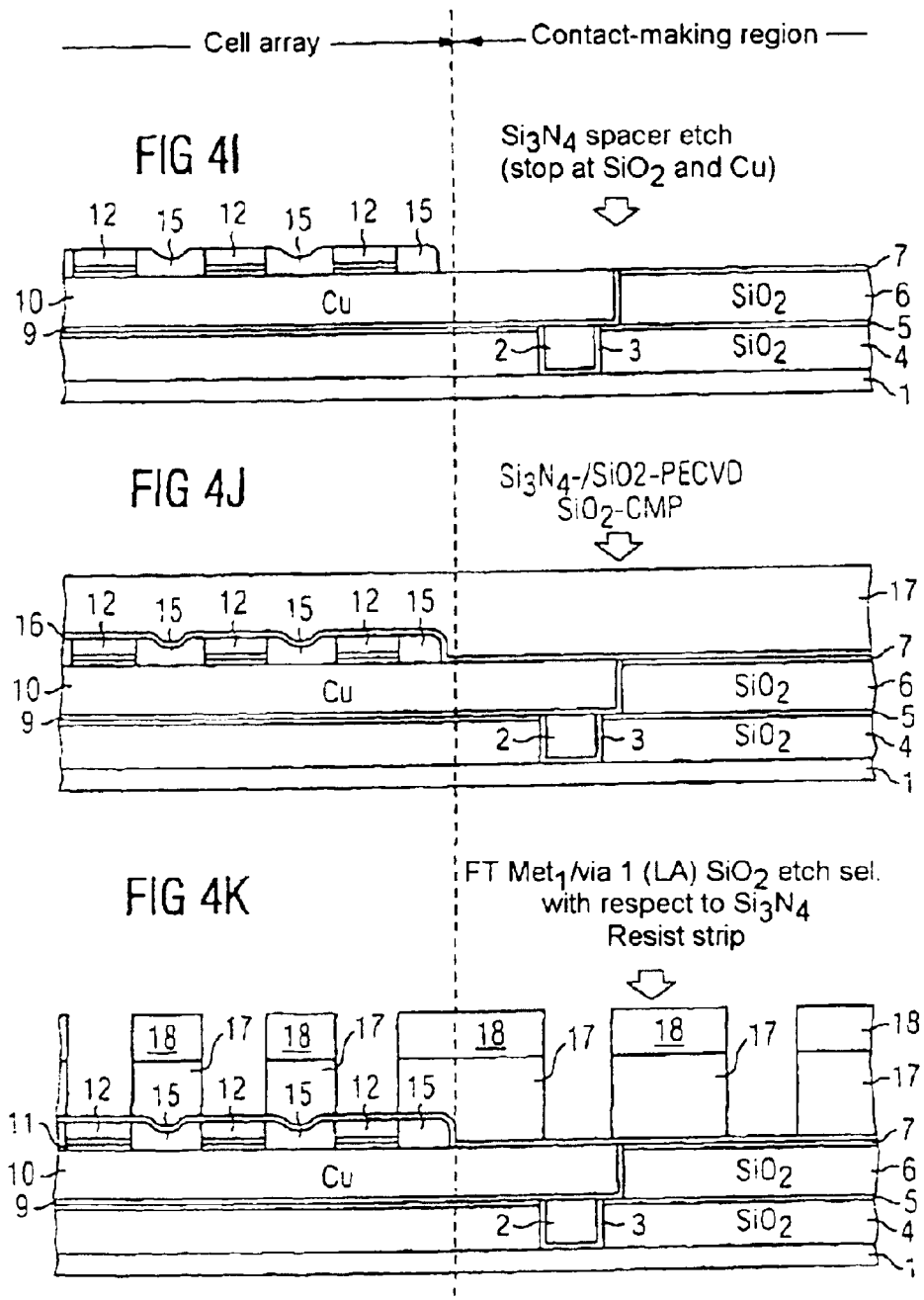

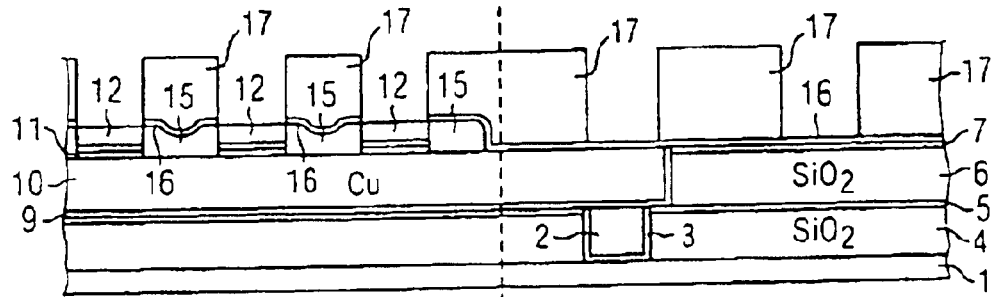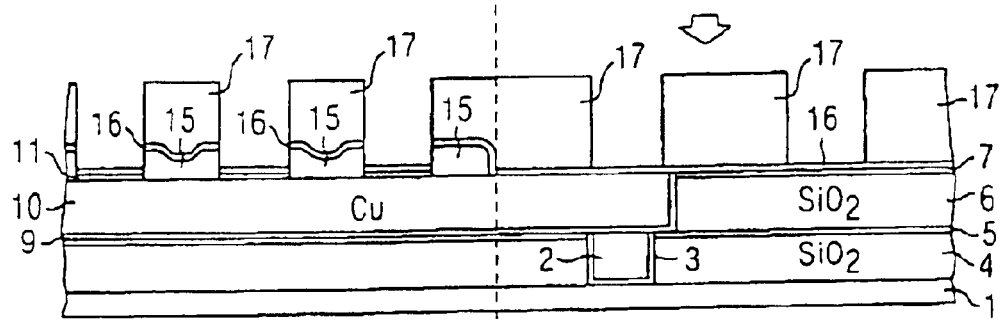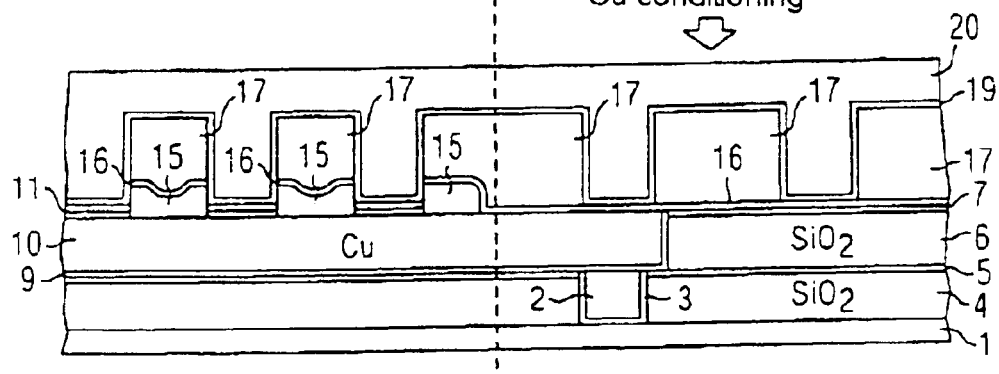

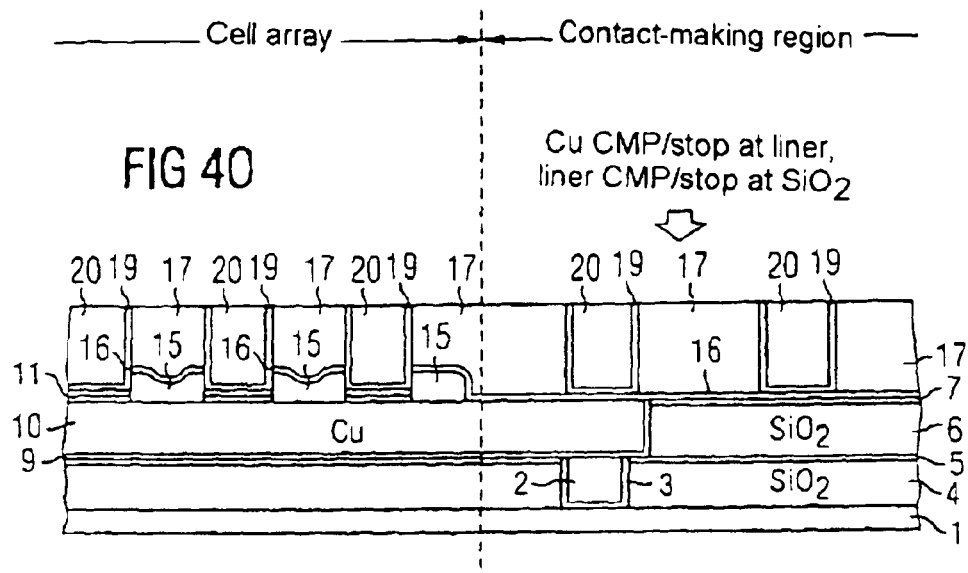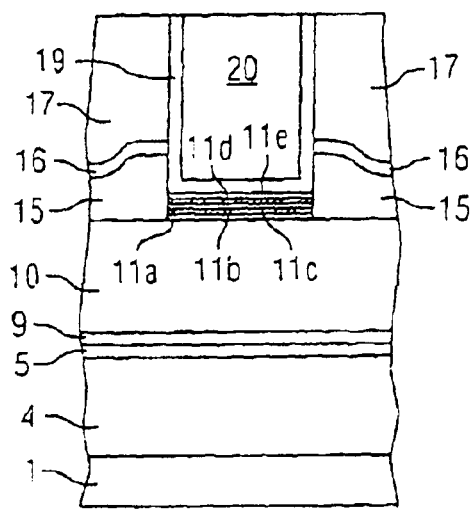

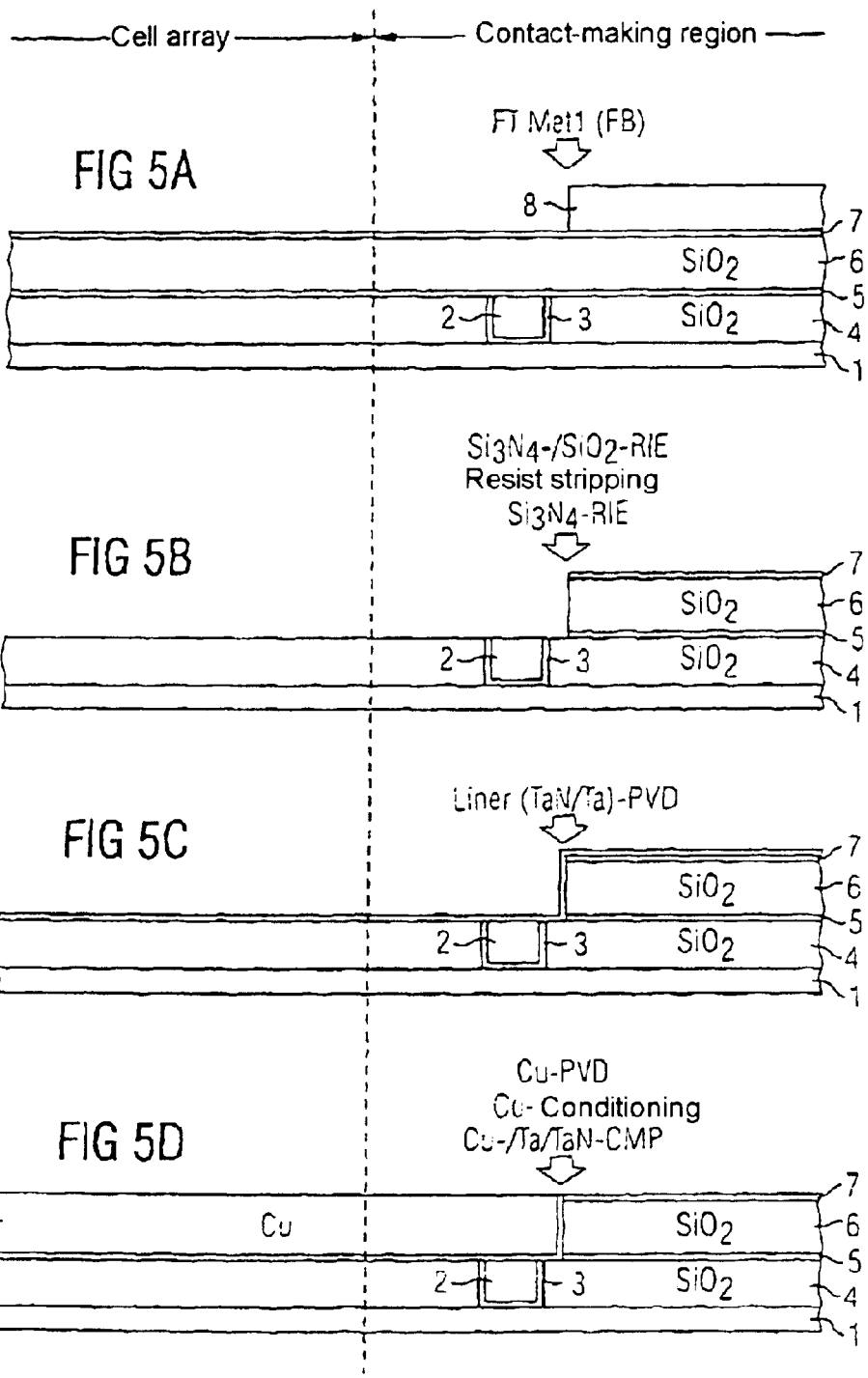

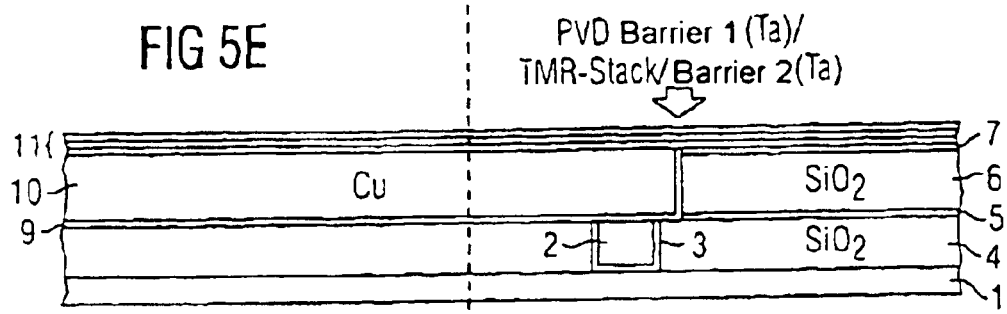
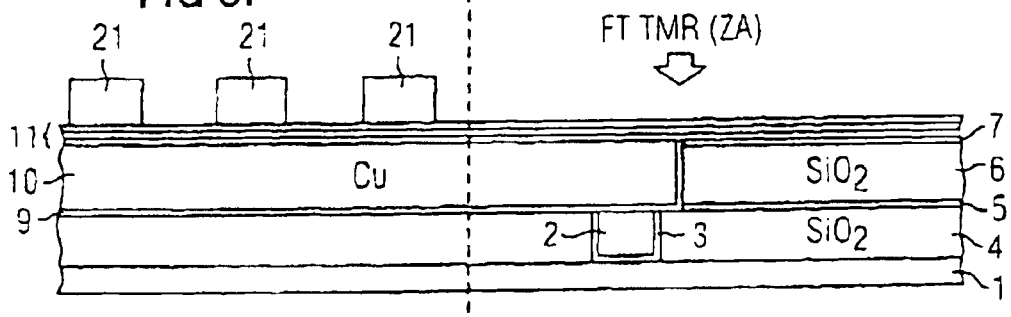
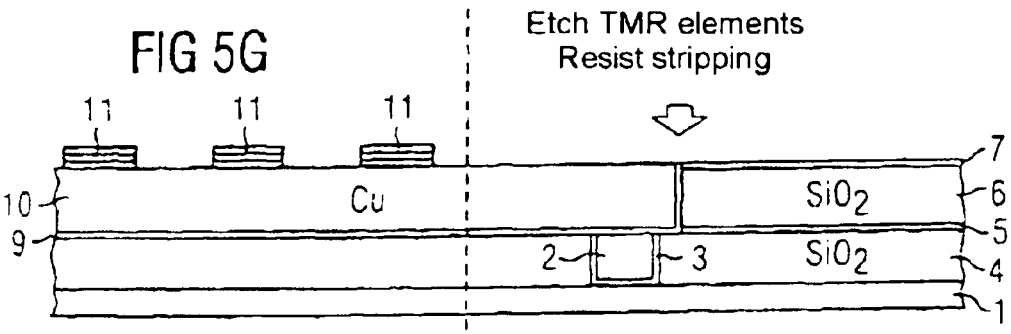
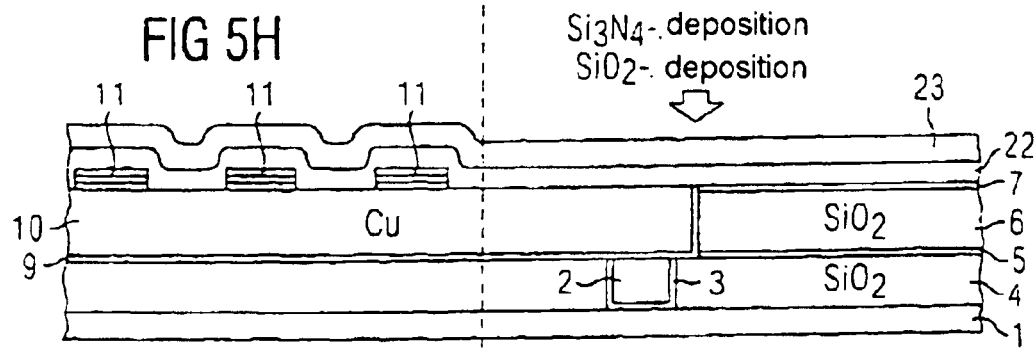

―――― Cell array ――――|―― Contact-making region ――

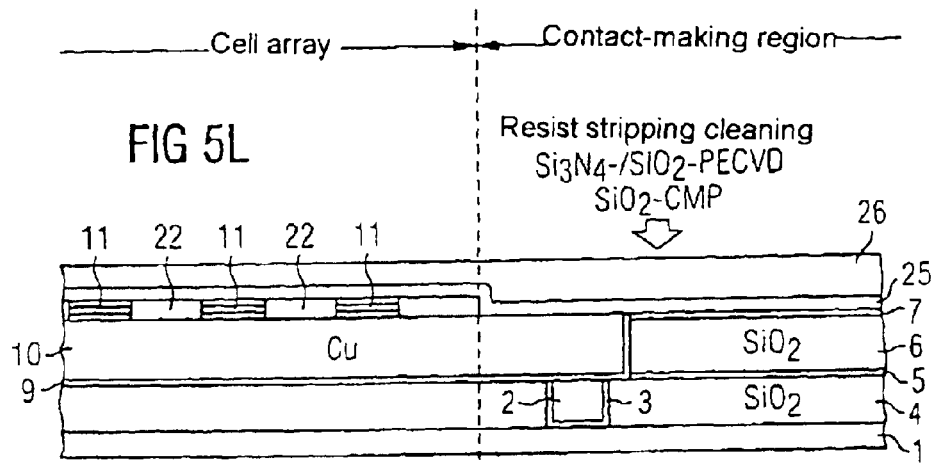
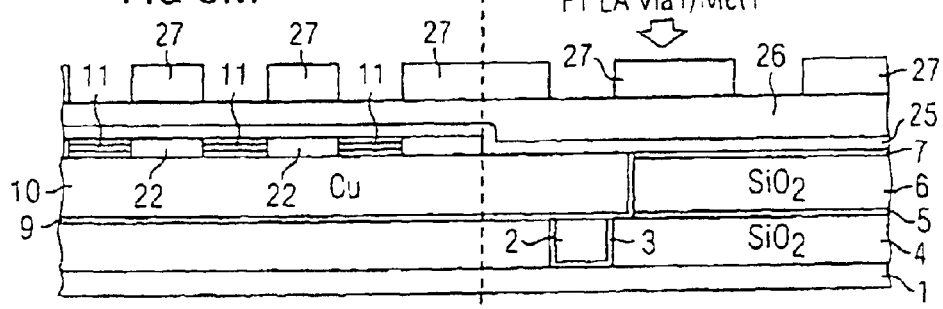
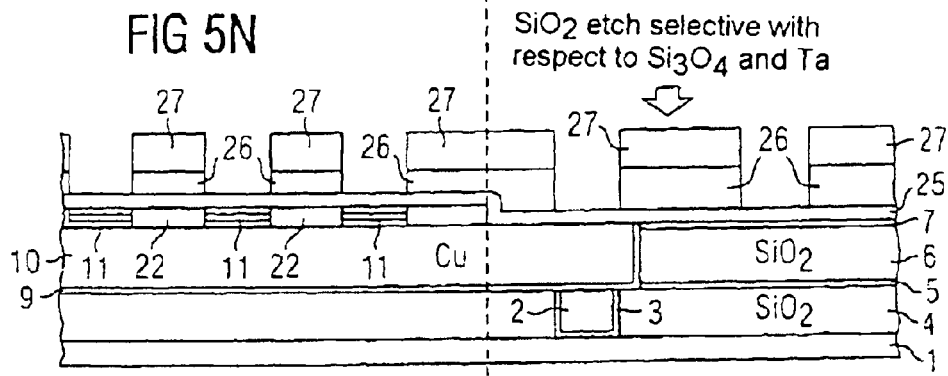

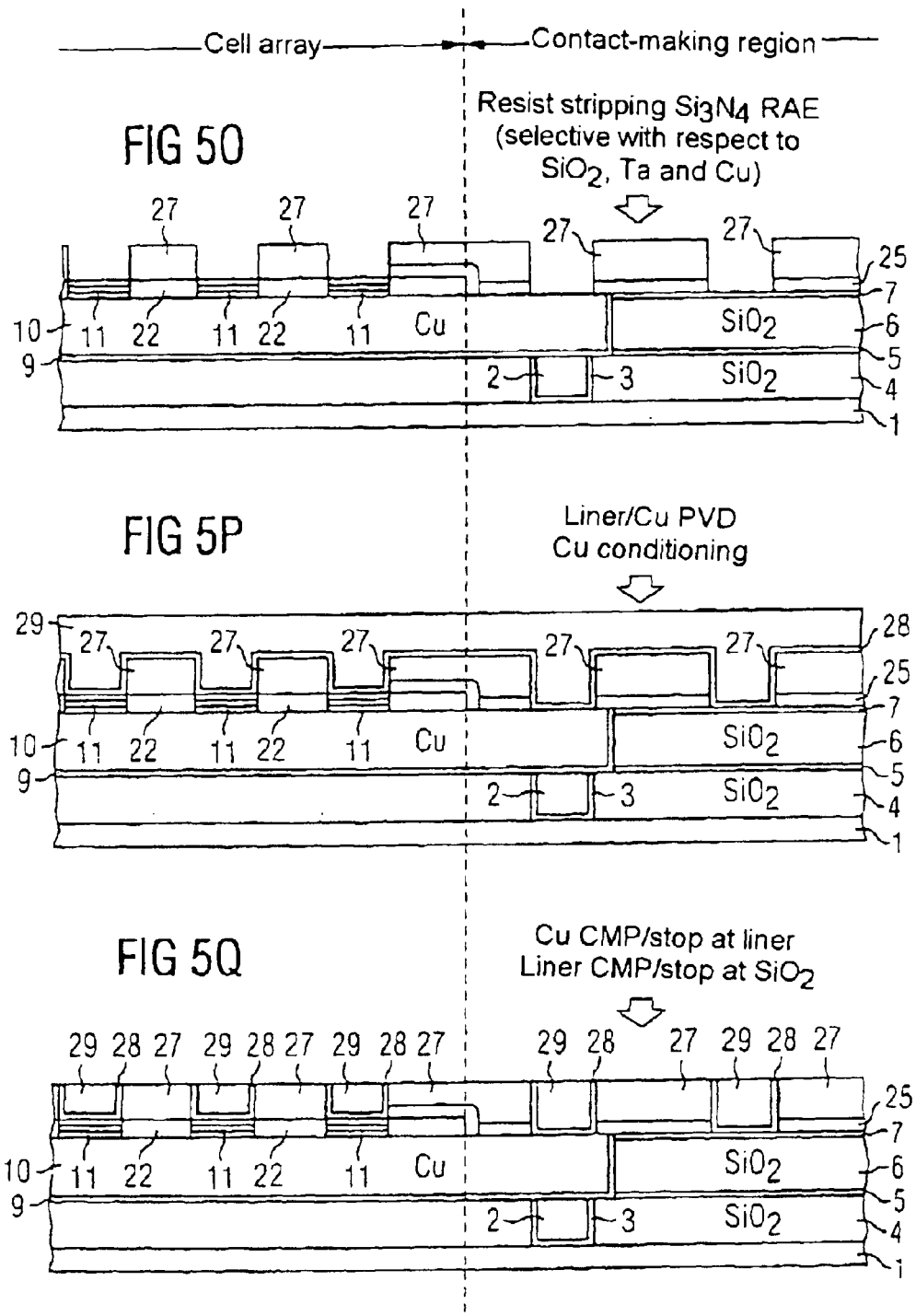

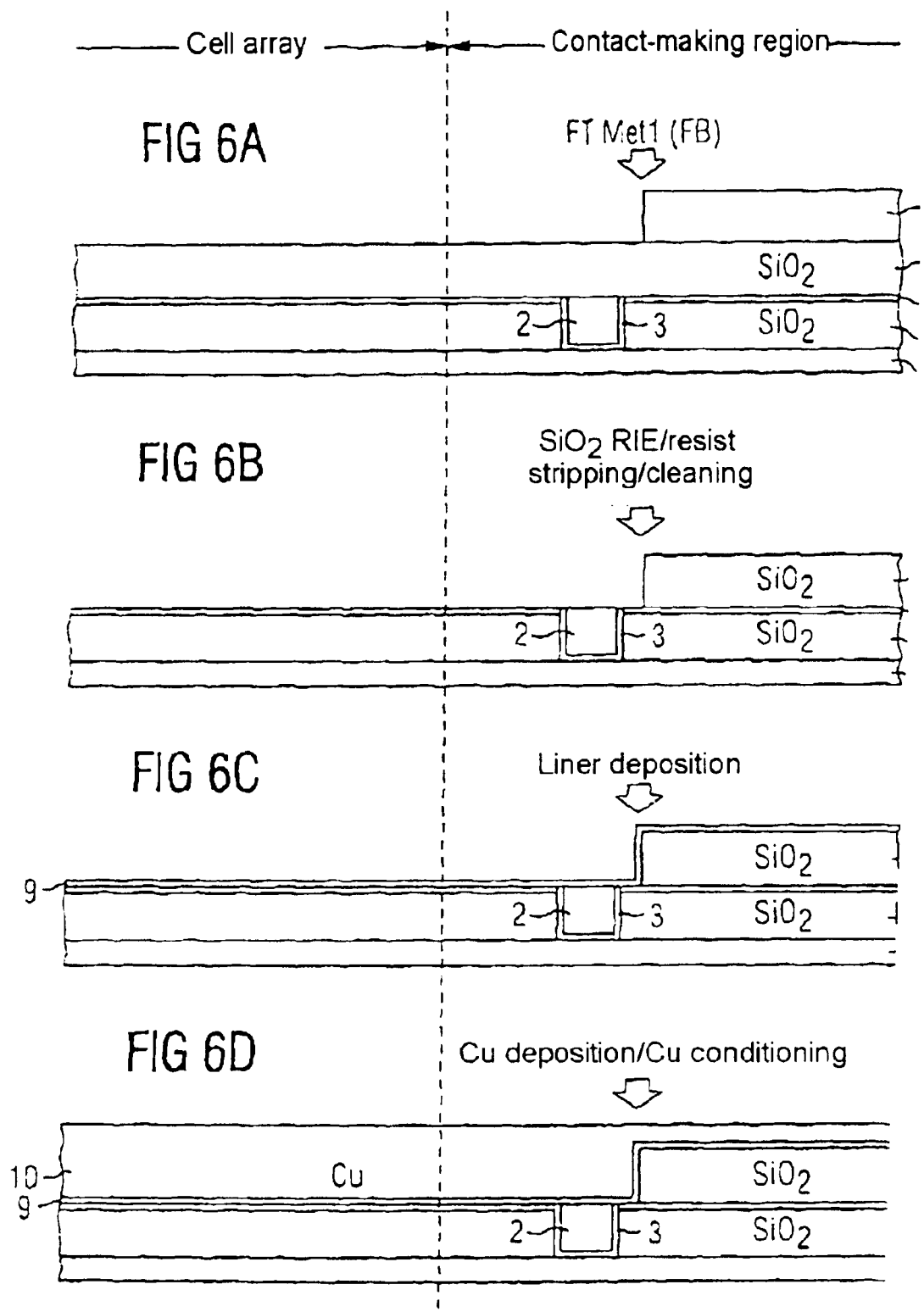

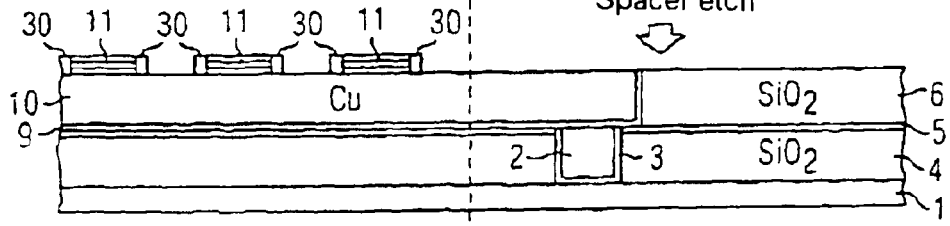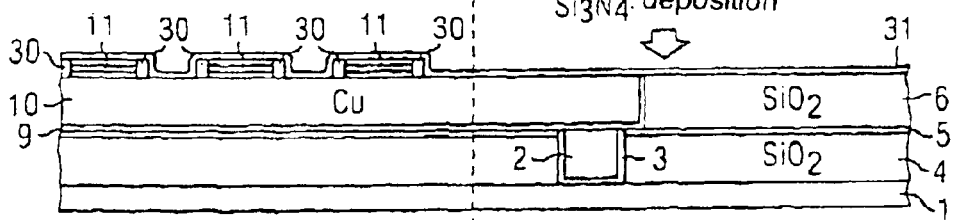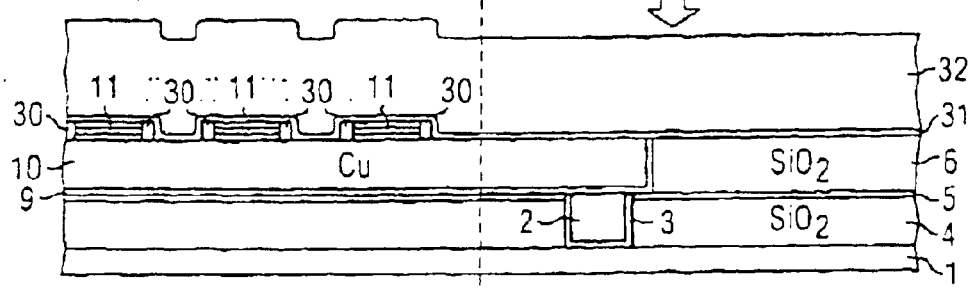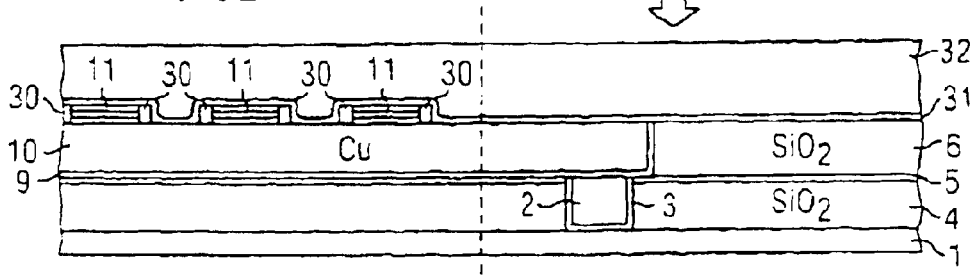

———— Cell array ————|—— Contact-making region ——

FT LA Via1/Met1

SiO2 etch selective with
respect to Si3N4
Resist stripping
Si3N4 etch selective with
respect to barrier 2, SiO2, Cu, ...

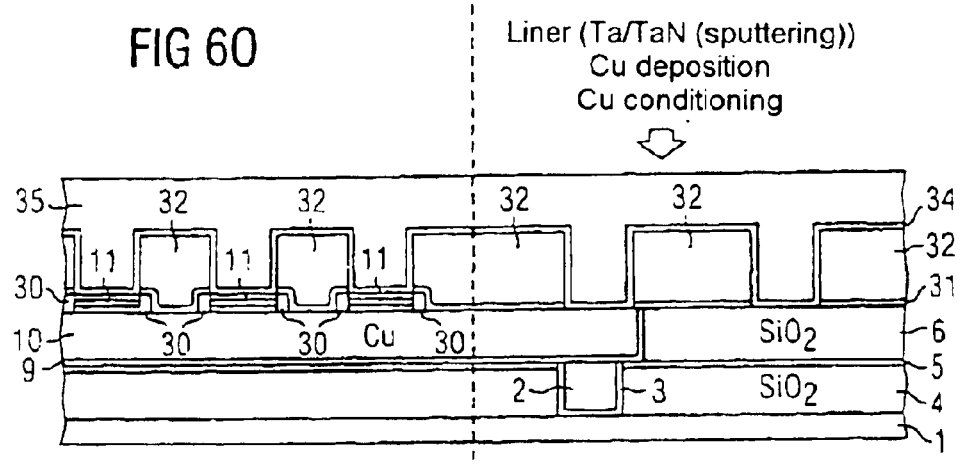
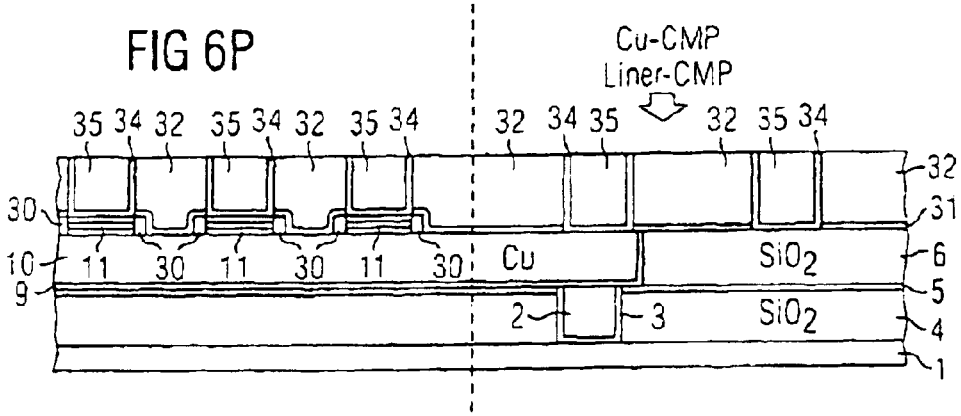

MEMORY CELL ARRANGEMENT AND METHOD OF FABRICATING IT

FIELD OF THE INVENTION

The invention relates to a memory cell arrangement having magnetoresistive memory components, and to a method for fabricating it.

BACKGROUND

MRAM memory components have ferromagnetic layers, the resistance of a memory component being dependent on the magnetization directions of the ferromagnetic layers. In the case of parallel magnetization of the ferromagnetic layers, the resistance of the memory component is low, while in the case of antiparallel magnetization of the ferromagnetic layers the resistance of the memory component is high.

SUMMARY

Depending on the layer structure of the MRAM memory component, a distinction is drawn between a GMR memory component and a TMR memory component. A GMR memory component has at least two ferromagnetic layers and a nonmagnetic conductive layer arranged between them, the GMR memory component having what is known as a GMR effect (GMR: giant magnetoresistance), in which the electrical resistance of the GMR memory component is dependent on whether the magnetizations in the two ferromagnetic layers are oriented parallel or antiparallel.

A TMR memory component (TMR: tunneling magnetoresistance) has at least two ferromagnetic layers and an insulating nonmagnetic layer arranged between them. The insulating layer is designed to be so thin that a tunneling current is produced between the two ferromagnetic layers. The ferromagnetic layers have a magnetoresistive effect which is produced by a spin-polarized tunneling current through the insulating, nonmagnetic layer arranged between the two ferromagnetic layers. The electrical resistance of the TMR memory component is dependent on whether the magnetizations of the two ferromagnetic layers are oriented parallel or antiparallel.

FIG. 1 shows a memory cell array of an MRAM memory according to the prior art. The memory cell array has a multiplicity of metallic write/read lines or word and bit lines which are arranged above one another and perpendicular to one another, and magnetoresistive memory components which in each case lie between two write/read lines which cross one another and are conductively connected thereto. Signals which are applied to the word lines or bit lines, on account of the currents flowing through them, cause magnetic fields which, given a sufficient field strength, influence the memory components. Compared to DRAM memories, these MRAM memories are distinguished by the fact that the individual memory components do not require a select transistor, but rather can be connected directly to the word and bit lines. MRAM memories (MRAM: magnetoresistant random access memories) are nonvolatile read memories with very high storage densities or storage capacities, which are achieved by stacking a plurality of cell arrays, i.e. a plurality of layers of memory components, on top of one another.

German patent application 199 085 18.8 describes an MRAM memory cell arrangement and a method for fabricating it.

FIG. 2 shows a cross-sectional view through a memory cell arrangement of this type in accordance with the prior art.

The MRAM memory has a cell array and a contact-making region or a peripheral region for making contact with the memory components which are present in the cell array. Magnetoresistive memory components, for example TMR memory components, are present in the memory cell array, are arranged in grid form in one plane and are in each case arranged between a first contact-making line KL1 and a second contact-making line KL2. The first contact-making lines KL1 run within a dielectric layer, for example made from silicon dioxide. The second contact-making lines KL2 likewise run within a dielectric layer, for example made from silicon dioxide. The memory components are likewise electrically insulated from one another by a layer of oxide. This layer of oxide is directly connected to the lower contact-making line KL1. In the MRAM memory illustrated in FIG. 2, the contact-making lines substantially comprise copper.

Contact is made with the contact-making lines via contact holes in the contact-making region. The contact holes are connected to the contact-making lines KL1, KL2 via metallic through-contacts. The through-contacts, which consist of metal, have an interlayer or liner made from TaN/Ta as bonding layer and diffusion barrier. The contact lines KL1, KL2 also have TaN/Ta layers or liner layers of this type. Furthermore, the contact-making line KL1 has a silicon nitride layer on its underside, acting as a diffusion barrier for the copper contact-making line KL1 with respect to the oxide layer beneath it.

The MRAM memory according to the prior art which is illustrated in FIG. 2, however, has a number of drawbacks. The contact-making lines KL1 are not completely surrounded or encapsulated by diffusion layers. The contact-making line KL1 consisting of copper is in direct contact with the intermetal dielectric consisting of oxide above it. Therefore, copper can diffuse into the intermetal dielectric. The diffusion of copper into the intermetal dielectric or the oxide layer degrades the dielectric layer and causes the conductivity of the dielectric layer to increase. Furthermore, copper atoms diffuse laterally into the memory elements and atomic constituents of the memory elements (e.g. Fe, Co, Ni) diffuse out of the memory elements into the intermetal dielectric. This results in memory drifts and, in the worst case scenario, to complete failure of the MRAM memory.

FIG. 3 shows an enlarged view of a memory component within the cell array of the conventional MRAM memory illustrated in FIG. 2. The magnetoresistive memory component, for example a TMR memory component, includes at least two ferromagnetic layers (FM) which are separated from one another by an insulating layer. Furthermore, there is in each case one tantalum layer for making contact with the two contact-making lines KL1, KL2. The tantalum layers Ta form diffusion barriers between the ferromagnetic layers (FM) and the contact-making lines KL, which consist of copper.

With the conventional memory cell arrangement, however, one drawback consists in the fact that the ferromagnetic layers FM and the first contact-making line KL1, which consists of copper, at the edges of the memory elements are only separated from one another by a dielectric oxide layer. The ferromagnetic layers contain Fe, Ni, Co, Cr, Mn, Gd and/or Dy and typically have a thickness of from 2 nm to 20 nm. The two tantalum layers for making contact with the memory component are also relatively thin, and consequently the distances between the two ferromagnetic layers and the contact-making lines KL1 and KL2 are relatively short. The intermetal dielectric consists of silicon dioxide, which does not form a diffusion barrier with respect to copper, which diffuses into the ferromagnetic layers, and with respect to iron, nickel, cobalt, chromium, manganese, Gd or Dy, which diffuse from the ferromagnetic layers (FM) into the intermetal dielectric and the contact-making lines KL1 and KL2.

Therefore, the memory component may be seriously degraded by copper diffusing into it. The diffusion of copper causes changes to the magnetoresistive effect and the switching performance of the memory components. The intermetal dielectric, which consists of silicon dioxide and in which the memory components are embedded, does not form an effective diffusion barrier either to copper or to the ferromagnetic elements present in the memory component at the process temperatures of between 250 and 450° C. which occur during fabrication of the memory.

Therefore, it is an object of the present invention to provide an MRAM memory and an associated fabrication method, the storage properties of which are not adversely affected by diffusion phenomena.

This object is achieved by a memory cell arrangement having the features described in patent claim 1 and by a method having the features described in patent claim 11.

The memory components are preferably TMR memory components which each have two ferromagnetic layers and an insulating nonmagnetic layer between these two ferromagnetic layers.

In an alternative embodiment of the memory cell arrangement according to the invention, the memory components are GMR memory components which each have two ferromagnetic layers and a conductive, nonmagnetic layer lying between the two ferromagnetic layers.

The memory components are preferably each connected to the contact-making lines via contact-making diffusion barrier layers.

The contact-making diffusion barrier layers preferably consist of tantalum.

The diffusion barrier layer provided between the first contact-making line and the second dielectric layer preferably additionally prevents interdiffusion between the layers of the memory components and the first contact-making lines.

In a preferred embodiment of the memory cell arrangement according to the invention, the first contact-making lines are separated from a third dielectric layer, which is arranged on a substrate, by a second diffusion barrier layer.

In a particularly preferred embodiment of the memory arrangement according to the invention, the diffusion barrier layer consists of silicon nitride.

The contact-making lines preferably substantially comprise copper.

In a preferred embodiment, the dielectric layers consist of silicon dioxide.

The invention furthermore provides a method for fabricating a memory cell arrangement, comprising the following steps, namely depositing and patterning the first contact-making lines in the first dielectric layer in a memory cell array of a semiconductor substrate, depositing and patterning the magnetoresistive memory components in the memory cell array, depositing and patterning the diffusion barrier layers in the memory cell array, depositing and patterning the second contact-making lines in the second dielectric layer of the memory cell array.

Preferred embodiments of the fabrication method according to the invention for fabricating the memory cell arrangement according to the invention are described in detail below with reference to the appended figures in order to explain features which are pertinent to the invention.

BRIEF DESCRIPTION OF THE DRAWINGS

FIGS. 4a to p show a first process variant for fabricating the memory cell arrangement according to the invention;

Figure 1:
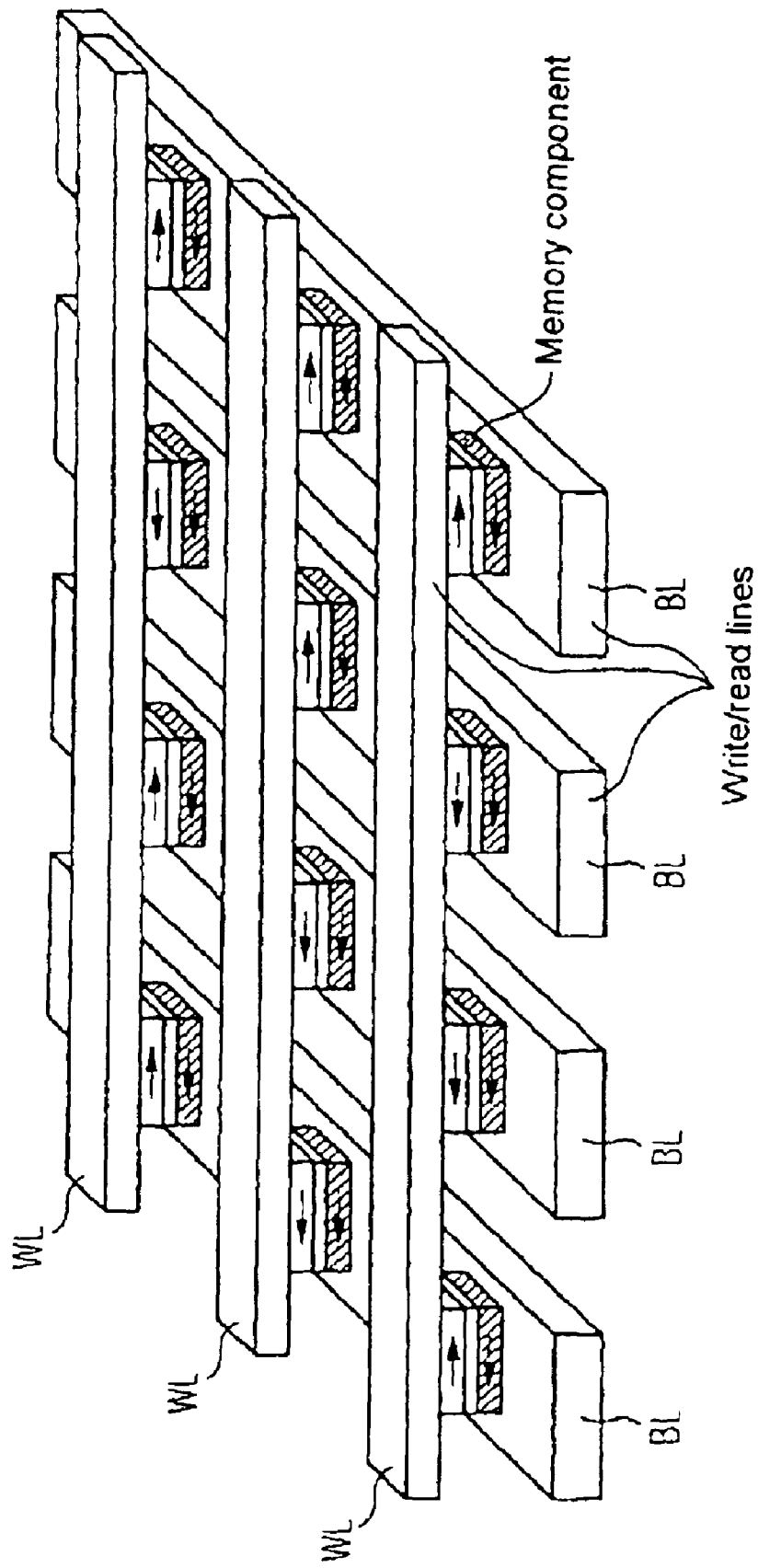
FIG. 1 shows a memory cell array according to the prior art.
Figure 2:
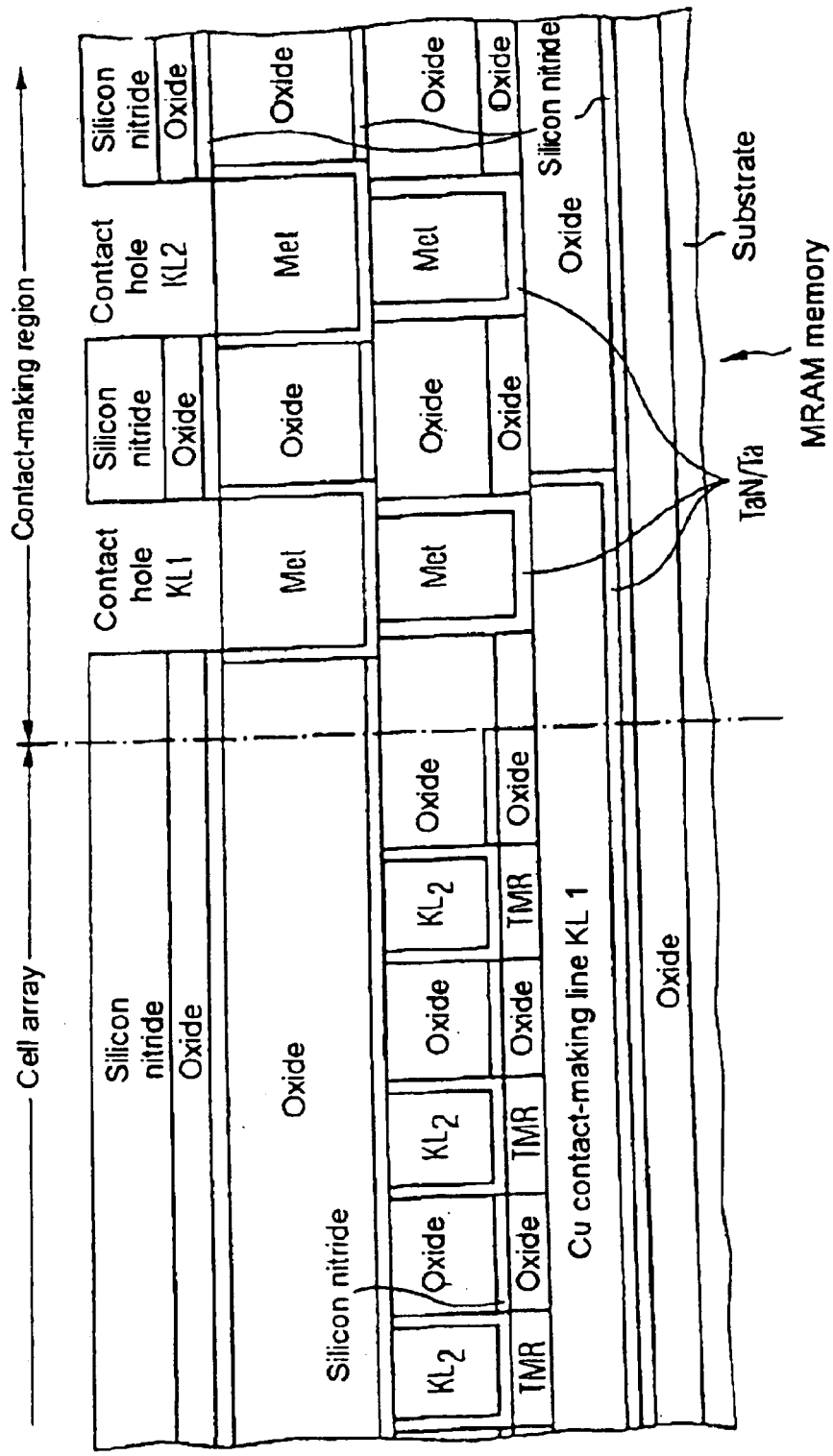
FIG. 2 shows a sectional view through an MRAM memory according to the prior art.
Figure 3:
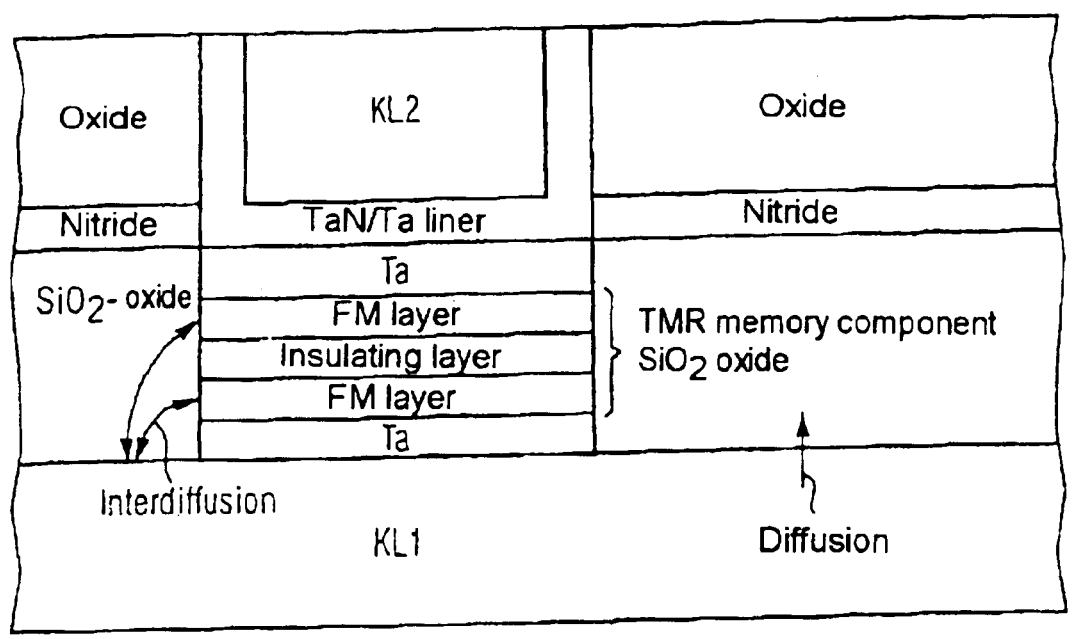
FIG. 3 shows an enlarged sectional view through a memory component within the conventional MRAM memory illustrated in FIG. 2, in order to explain the problem on which the invention is based.

In the text which follows, the first process variant for the fabrication of the memory cell arrangement according to the invention is described in detail with reference to FIGS. 4a to p.

DETAILED DESCRIPTION

A semiconductor substrate, preferably a silicon substrate, 1 contains the integrated CMOS or bipolar electronics (FEOL) and if appropriate one or two wiring levels. To make contact with the electronics situated in the semiconductor substrate 1, a through-contact or via 2 with a liner layer 3 is formed into a silicon dioxide layer 4 which covers the semiconductor substrate 1. A first silicon nitride layer 5 serves as an etching stop layer during the reactive ion etching (RIE) of the intermetal dielectric 6 above it and as a diffusion barrier layer. The intermetal dielectric 6 consists of silicon dioxide. A further silicon nitride layer 7 is provided as etching stop for a subsequent Damascene etch. The silicon nitride layer 7 is covered with a resist mask 8 in the contact-making region, and after photolithographic steps have been carried out, the silicon nitride layer 7 and the silicon dioxide layer 6 are etched away by reactive ion etching RIE in the memory cell array region, the silicon nitride layer 5 serving as an etching stop layer. The etching is carried out anisotropically and selectively with respect to the lower silicon nitride layer 5.

Then, a liner 9 consisting of Ta/TaN is deposited by a PVD process (PVD: physical vapour deposition). First of all, a layer of TaN is deposited, followed by a layer of Ta, forming a Ta/TaN double layer. FIG. 4c shows the resulting process state.

In a further process step, copper is deposited by PVD. Since only individual Damascene trenches with low aspect ratios of less than 1 are used for the MRAM memory cell arrangement according to the invention, one PVD process (PVD: physical vapor deposition) is sufficient to fill these trenches. The aspect ratio represents the ratio between the height and width of a trench. In an alternative embodiment, electroplating is used. The deposited copper 10, which forms the first contact-making lines for making contact with the memory components, is then conditioned in order to increase the physical density. This is necessary in order to put an end to relaxation processes in the copper, i.e. aggregation of microcavities, prior to the subsequent chemical mechanical process steps CMP, which would otherwise have adverse effects on the quality of the polished copper surfaces and the quality of the TMR memory components. In subsequent chemical mechanical polishing steps (CMP: chemical mechanical polishing), excess copper and the liner layer lying on the silicon nitride layer 7 are removed. FIG. 4d shows the resulting state. The multistage chemical mechanical polishing step CMP for removing copper and the liner material comprising Ta/TaN is stopped by the silicon nitride layer 7. The roughness of the polished copper surface of the copper layer 10 preferably does not exceed 4 to 8 Ångstrom.

In further process steps, the memory element layers, such as the contact-making diffusion barrier layers made from tantalum, are deposited over the entire surface. FIG. 4e shows the resulting process state. The deposition should take place within a vacuum system without ventilation between the individual deposition operations, i.e. PVD or IBB. the five memory layers applied are denoted by reference symbols 11a to 11e in FIG. 4e.

Then, a silicon dioxide layer 12 is deposited on the five-layered memory component layer 11a to 11e by PECVD processes in order to produce a hard mask for the subsequent memory component patterning. The thickness of the hard mask is approximately two to three times that of the five-layered memory component layer beneath it. The hard mask 12 made from silicon dioxide is etched using a resist mask 13. The hard mask 12 makes it possible to produce steeper flanks on the TMR memory components for the subsequent spacer etch, to completely fill the TMR interspaces with silicon nitride, to completely encapsulate the memory components with diffusion barriers and to ash the resist by means of $O_2$ plasma before the copper interconnects are uncovered, i.e. to avoid oxidation of the copper interconnects. After the etching of the hard mask 12 has been carried out, the resist layer 13 is stripped or removed. Finally, an RIE etch takes place in order to pattern the multilayer memory components selectively with respect to the hard mask. FIG. 4g shows the resulting process state.

Finally, a silicon nitride layer is deposited by means of PE-CVD in a thickness which is sufficient to completely fill the spaces between the memory components 11a to e. FIG. 4h shows the silicon nitride 14 which has been deposited.

In a further step, the deposited silicon nitride is etched anisotropically and selectively with respect to silicon dioxide and copper, in order to form spacers 15. In the memory cell arrangement which has been formed in accordance with the first process variant, the spacers 15 subsequently form the diffusion barriers. A further silicon nitride layer 16, which is approx. 50 nm thick, is deposited above the resulting structure shown in FIG. 4i as an etching stop layer for a Damascene etch. The silicon nitride layer 16 is covered by a further silicon dioxide layer 17, which is subjected to chemical mechanical polishing. FIG. 4j shows the resulting structure.

This is followed by an anisotropic etch, which is selective with respect to the silicon nitride, of the silicon dioxide layer 17 by plasma etching. A photoresist mask 18 is used. The photoresist mask 18 is then removed or stripped.

In a further process step, the silicon nitride layer 16 is etched selectively with respect to silicon dioxide and copper by means of a gentle low-energy process, in order to minimize back-sputtering of copper onto the silicon dioxide etched flanks. FIG. 4l shows the resulting process state.

In a further etching step, the silicon dioxide layer 12 lying on the memory components is etched away, preferably anisotropically. This etching back is a self-aligning etching process, i.e. etching takes place only at those locations at which memory components 11 are situated. The etching back results in the formation of self-aligning contact surfaces with respect to the memory components 11. FIG. 4m shows the resulting process state. The resulting Damascene structures are filled by sputtering of Ta/TaN liners 19 and a sufficiently thick copper layer 20 in a PVD process. The deposited copper is then conditioned in order to increase the physical density. FIG. 4n shows the resulting structure.

Finally, the deposited copper and the deposited liner layer are partially removed in a two-stage chemical mechanical polishing step (CMP), resulting in the structure shown in FIG. 4o.

FIG. 4p shows a detailed view of a memory component 11 within the memory cell array as produced by means of the first process variant. The memory component 11 comprises two ferromagnetic layers 11b, 11d, which are separated by an insulating, nonmagnetic layer 11c lying between them. Contact-making diffusion barrier layers 11a, 11f made from tantalum are provided between the first contact-making line 10, which consists of copper, and the second contact-making line 20, which consists of copper and lies in a liner 19, and the TMR memory component. The TMR memory element 11 with the contact-making diffusion barrier layers 11a, 11f is completely surrounded by the diffusion barrier layer 15 made from silicon nitride. Furthermore, the diffusion barrier layer 15 separates the contact-making line 10 consisting of copper from the intermetal dielectric 17 consisting of silicon dioxide. The diffusion barrier layer suppresses the diffusion of copper into the intermetal dielectric 17. Furthemore, the diffusion barrier layer 15 suppresses the interdiffusion between the ferromagnetic layers 11b, 11c of the memory component 11 and the first contact-making line 10. Therefore, both degradation of the intermetal dielectric 17 and of the memory components 11 on account of diffusion is prevented by the diffusion barrier layer 15.

FIG. 4p illustrates the most simple layer structure of the memory components. Further auxiliary layers for optimizing and stabilizing the magnetic properties are not shown.

The memory cell arrangement illustrated in FIG. 4o is of only single-layer structure. However, it is possible for a plurality of layers of memory components 11 to be positioned one on top of the other by means of further process steps, so that a high storage capacity can be achieved in the MRAM memory. Contact can be made with multilayer memory cell arrays of this type by means of a Damascene multilayer wiring.

As can be seen from FIG. 4n, the first contact-making lines 10 are completely encapsulated by diffusion barrier layers 5, 9, 15. The diffusion barrier layers 5 made from silicon nitride and 9 made from TaNiTa prevent diffusion of copper into the dielectric layer 4 of silicon dioxide below them. The diffusion barrier layer 15 prevents diffusion of copper into the memory components 11 and into the dielectric layer 17 above, i.e. the intermetal dielectric, in the region of the memory cell array. Electrical contact is made with the first contact lines 10 through via contacts. The second contact-making lines 20 are electrically connected through metal contacts via connecting lines (not shown) which surround the via through-contacts.

FIGS. 5a to g show a further process variant for fabrication of the memory cell arrangement according to the invention. The first process steps take place as in the first fabrication variant, which is illustrated in FIG. 4. FIGS. 5a to e correspond to FIGS. 4a to e of the first process variant.

Figure 5I:
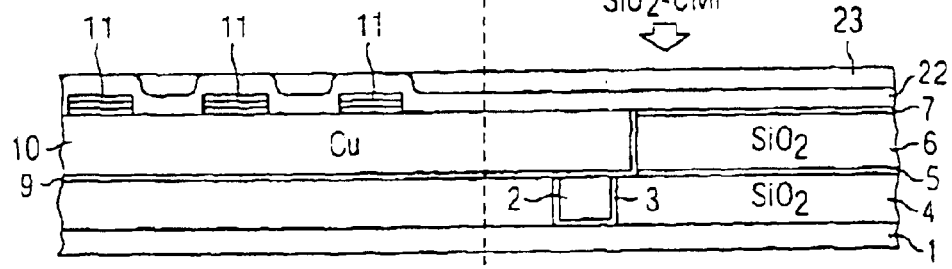
FIGS. 5a to q show a second process variant for fabricating the memory cell arrangement according to the invention.

As illustrated in FIG. 5f, in the second process variant the memory component layers 11a–11e, after they have been applied, are patterned by etching by means of a photoresist mask 21. The mask 21 is then removed by stripping. FIG. 5g shows the resulting process state. Then, a silicon nitride layer 22 and a silicon dioxide layer 23 are deposited above the structure shown in FIG. 5g, as can be seen from FIG. 5h.

Figure 5J:
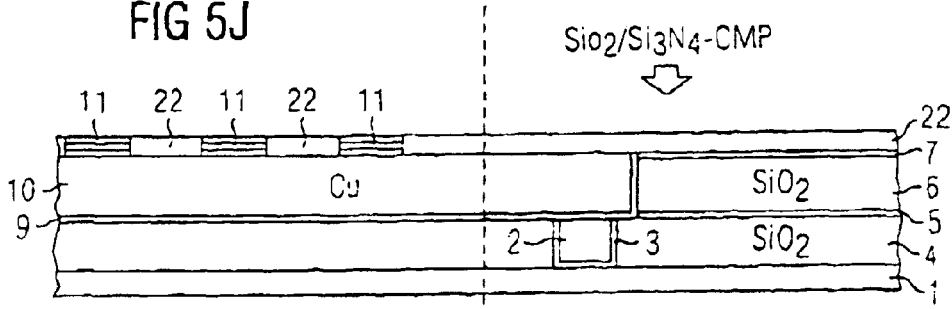

The two deposited layers 22, 23 are then subjected to chemical mechanical polishing steps, so that the structure illustrated in FIG. 5j is formed. The memory cell array is then covered with a resist mask 24, and the silicon nitride layer 22 is removed by means of RIE etching in the region of the memory periphery or in the contact-making region. The result is the structure illustrated in FIG. 5k.

The photoresist mask 24 is removed, and after a cleaning step first of all a silicon nitride layer 25 and a silicon dioxide layer 26 are deposited by means of PECVD. The surrounding silicon dioxide layer 26 is leveled by means of chemical mechanical polishing CMP, resulting in the structure illustrated in FIG. 5l.

Then, a photoresist mask 27 is applied to the silicon dioxide layer 26 and patterned. The result is the structure illustrated in FIG. 5m.

In a further process step, the silicon dioxide layer 26 is etched selectively with respect to silicon nitride and Ta. FIG. 5n shows the resulting arrangement.

Finally, the photoresist mask 27 is removed again and the silicon nitride layer 25 is removed selectively with respect to silicon dioxide, tantalum and copper by means of RIE etching in the uncovered regions. As a result, the memory components 11 in the memory cell array and connections for the contact lines 10 are uncovered. The structure shown in FIG. 5o is covered firstly with a liner layer 28 and then with a copper layer 29 by means of PVD processes. The copper layer 29 is then conditioned. FIG. 5p shows the resulting structure.

In a further step, the excess copper is removed in a chemical mechanical polishing step CMP which stops at the liner layer 28. Finally, the liner layer 28 is removed in a further chemical mechanical polishing step CMP which stops at the silicon dioxide layer 17, resulting in the structure illustrated in FIG. 5q.

As can be seen from FIG. 5q, the first contact-making lines 10 are separated from the intermetal dielectric 27, which consists of silicon dioxide, by the diffusion barrier layer 22 consisting of silicon nitride, so that there can be no diffusion of copper into the dielectric 27. Furthermore, the diffusion barrier layer 22 prevents interdiffusion between the layers of the memory components 11 and the contact-making lines 10.

Figure 5K:
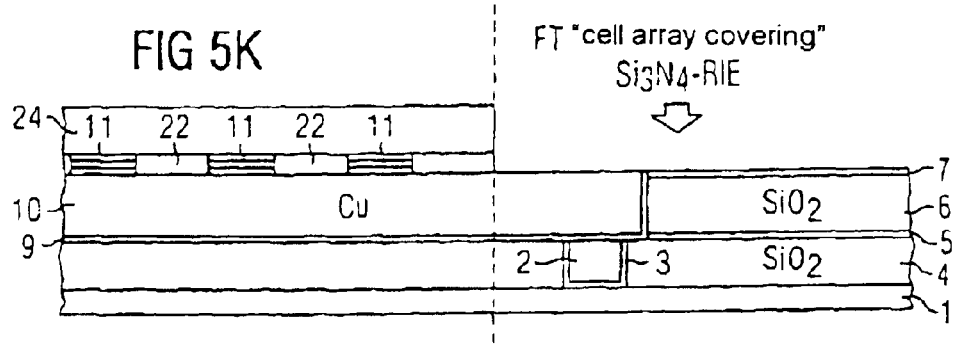
Figure 6E:
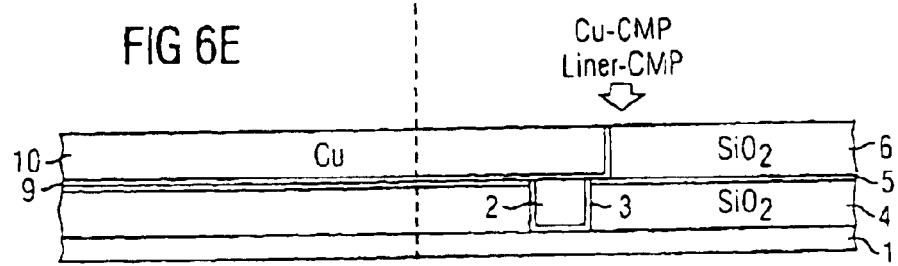
FIGS. 6a to p show a third process variant for fabricating the memory cell arrangement according to the invention.
Figure 6F:
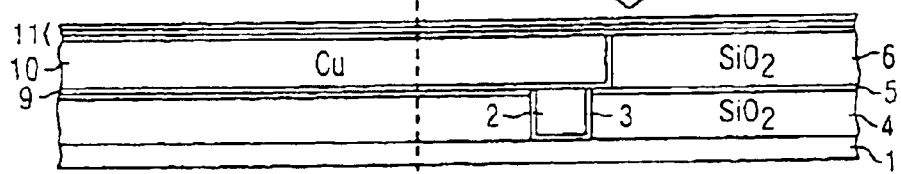
Figure 6G:
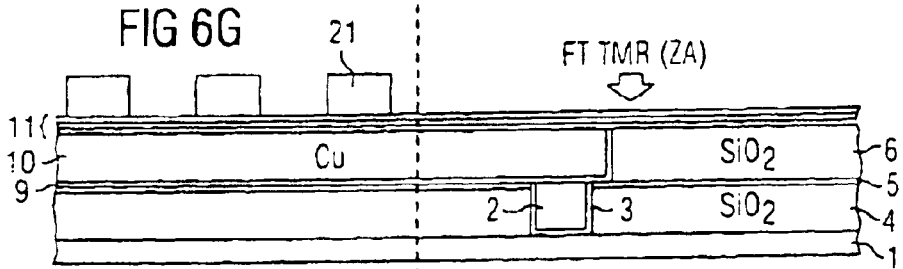
Figure 6H:
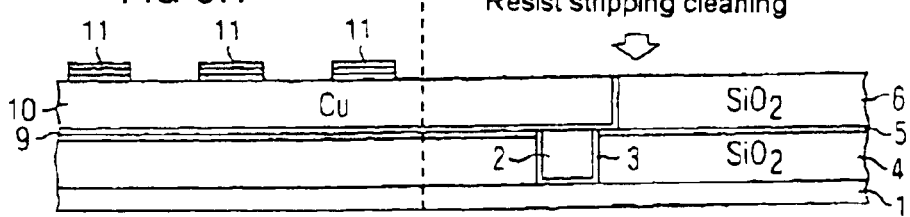
Figure 6M:
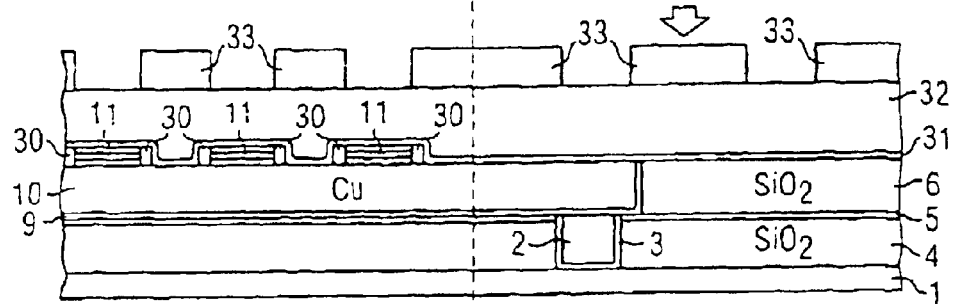
Figure 6N:
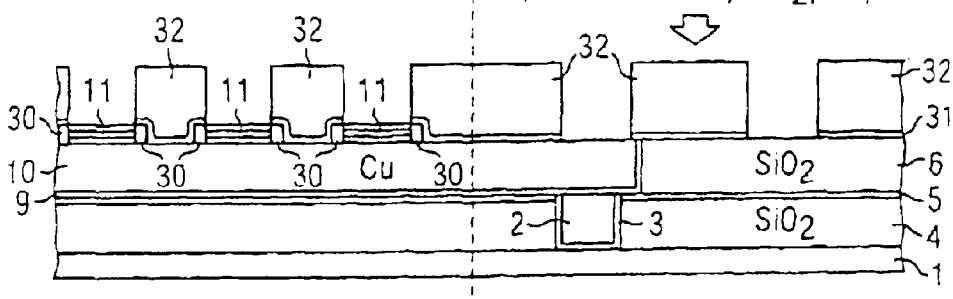

FIGS. 6a to n show a third process variant for fabrication of the memory cell arrangement according to the invention. The first process steps correspond to the two processes illustrated in FIGS. 4 and 5. FIGS. 6a to f correspond to FIGS. 4a to e and FIGS. 5a to e of the two process variants which have already been described. FIGS. 6g and h correspond to the process steps of the second process variant which have been shown in FIGS. 5f and g.

As can be seen from FIG. 6i, in the third process variant for fabrication of the memory cell arrangement according to the invention, a silicon dioxide layer is deposited on the patterned memory components 11 and is then etched back by means of an anisotropic etching step without a photomask in order to form spacers 30 which surround the memory components 11.

A silicon nitride layer 31 is deposited in a further step, resulting in the structure shown in FIG. 6j.

Then, a silicon dioxide layer 32 is deposited and subjected to chemical mechanical polishing, resulting in the structure illustrated in FIG. 6l.

A photomask 33 is applied to the smooth silicon dioxide layer 32, and the silicon dioxide layer 32 is etched selectively by means of the photomask 33. The photoresist mask 33 is then removed. Finally, in a further etching step, a silicon nitride etch is carried out selectively with respect to silicon dioxide and copper, resulting in the structure shown in FIG. 6n.

Finally, the structure is covered with a liner double layer comprising Ta/TaN by means of sputtering, and this liner double layer is then covered with copper which is then conditioned. Finally, the copper layer 35 and the liner layer 34 below it are removed by means of chemical mechanical polishing, resulting in the structure shown in FIG. 6p.

As can been seen from FIG. 6p, the contact-making lines 10 made from copper are separated from the intermetal layer 32 above them by a diffusion barrier layer 7 which prevents copper from diffusing into the dielectric layer 32. A diffusion barrier layer 5 and the liner 9 furthermore prevent copper from diffusing into the dielectric layer 4.

The memory cell arrangement which has been produced in accordance with process variant 3, compared to memory cell arrangements which have been fabricated in accordance with the first two process variants, as illustrated in FIGS. 5 and 6, has the drawback that the oxide spacers 30 do not prevent interdiffusion between the memory components and the first contact-making line 10. On the other hand, the third process variant as shown in FIG. 6 has the advantage over process variant 2 that it is a relatively simple fabrication process which does not include any critical CMP process steps and does not require an auxiliary mask to protect the memory element cell array during the etching back of the silicon nitride in the periphery (FIG. 5k).

The first process variant, which was described in conjunction with FIG. 4, offers further advantages in addition to the prevention of diffusion phenomena. There is no need for an auxiliary lithographic mask, which ensures that the side flanks of the memory components 11 are not uncovered during the via etch in the periphery and the trench etch for the upper lines in the memory cell array and are not short circuited by the subsequent depositions of metal. Rather, the etching process for uncovering the memory components is self-aligning. In the case of the silicon dioxide trench etch, an etching stop layer of silicon nitride prevents unreproducible etching depths and interconnect resistances from being produced. Furthermore, copper is prevented from being redeposited on the silicon dioxide flanks of the vias and trenches during the silicon dioxide trench etch and is prevented from being able to diffuse into the intermetal dielectric and into the memory components.

Furthermore, all the process variants according to the invention prevent uncovered copper from being oxidized by resist stripping following the trench etch on account of the $O_2$-containing standard plasma process used. This makes it possible to eliminate cleaning steps for removal of corroded copper surfaces.

LIST OF REFERENCE SYMBOLS

1 Semiconductor substrate
2 Via
3 Liner
4 Silicon dioxide layer
5 Silicon nitride layer
6 Silicon dioxide layer 7 Silicon nitride layer
8 Photoresist mask
9 Liner
10 Contact-making lines
11 Memory component
12 Silicon dioxide layer
13 Photoresist mask
14 Silicon nitride layer
15 Silicon nitride spacer
16 Silicon nitride layer
17 Silicon dioxide layer
18 Photoresist mask
19 Liner
20 Second contact-making lines
21 Photoresist mask
22 Silicon nitride layer
23 Silicon oxide layer
24 Photoresist mask
25 Silicon nitride layer
26 Silicon dioxide layer
27 Photoresist mask
28 Liner
29 Second contact-making lines
30 Silicon dioxide spacer
31 Silicon nitride layer
32 Silicon oxide layer
33 Photoresist mask
34 Liner
35 Second contact-making lines

What is claimed is:

1. A memory cell arrangement comprising:
    a memory cell array having at least one layer of magnetoresistive memory components, each of which has at least two ferromagnetic layers,
    first and second dielectric layers,
    copper first contact-making lines lying within the first dielectric layer, the first contact-making lines being connected to a first of the at least two ferromagnetic layers,
    copper second contact-making lines lying within the second dielectric layer, the second contact-making lines being connected to a second of the at least two ferromagnetic layers, and
    a silicon nitride diffusion barrier layer between the first contact-making lines and the second dielectric layer, the diffusion barrier layer being in direct contact with the magnetoresistive memory components and being configured to minimize memory drift
    by suppressing diffusion of copper out of the first contact-making lines into the second dielectric layer and into the magnetoresistive memory components, and
    by suppressing interdiffusion between the ferromagnetic layers and the first contact-making lines.

2. The memory cell arrangement according to claim 1, wherein the magnetoresistive memory components comprise TMR memory components, each of which comprises
    two ferromagnetic layers, and
    an insulating nonmagnetic layer between the two ferromagnetic layers.

3. The memory cell arrangement according to claim 1, wherein the magnetoresistive memory components comprise GMR memory components, each of which comprises
    two ferromagnetic layers, and
    a conductive nonmagnetic layer between the two ferromagnetic layers.

4. The memory cell arrangement according to claim 1, wherein the magnetoresistive memory components are each connected to the contact-making lines via contact-making diffusion barrier layers.

5. The memory cell arrangement according to claim 4, wherein the contact-making diffusion barrier layers comprise tantalum.

6. The memory cell arrangement according to claim 1, further comprising:
    a third dielectric layer disposed on a semiconductor substrate,
    a second diffusion barrier layer and
    a liner,
    the second diffusion barrier layer and the liner being disposed to separate the third dielectric layer from the first contact making lines.

7. The memory cell arrangement according to claim 1 wherein the first and second dielectric layers comprise silicon dioxide.

8. A method for fabricating the memory cell arrangement according to claim 1, the method comprising:
    (a) depositing and patterning the first contact-making lines in the first dielectric layer;
    (b) depositing and patterning the magnetoresistive memory components in the memory cell array;
    (c) depositing and patterning the diffusion barrier layer such that the diffusion barrier layer is in direct contact with the magnetoresistive memory components;
    (d) making self-aligned contacts with the semiconductor components by etching back a hard mask that defines the patterning of the magnetoresistive memory components,
    (e) depositing and patterning the second contact-making lines in the second dielectric layer.

* * * * *